US008717300B2

(12) United States Patent
Kishi

(10) Patent No.: US 8,717,300 B2
(45) Date of Patent: May 6, 2014

(54) DISPLAY DEVICE

(75) Inventor: Noritaka Kishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 271 days.

(21) Appl. No.: 13/148,299

(22) PCT Filed: Mar. 2, 2010

(86) PCT No.: PCT/JP2010/001395
§ 371 (c)(1), (2), (4) Date: Aug. 5, 2011

(87) PCT Pub. No.: WO2010/131397
PCT Pub. Date: Nov. 18, 2010

(65) Prior Publication Data

US 2011/0292025 A1 Dec. 1, 2011

(30) Foreign Application Priority Data

May 13, 2009 (JP) ................................ 2009-116642

(51) Int. Cl.

| | |
|---|---|
| ***G06F 3/02*** | (2006.01) |
| ***G09G 5/00*** | (2006.01) |
| ***G06F 3/041*** | (2006.01) |
| ***G06F 3/045*** | (2006.01) |
| ***G06F 3/042*** | (2006.01) |
| ***G06F 3/043*** | (2006.01) |
| ***H03F 1/02*** | (2006.01) |
| ***H03F 3/00*** | (2006.01) |

(52) U.S. Cl.
USPC ........... 345/172; 345/173; 345/174; 345/175; 345/176; 345/177; 345/178

(58) Field of Classification Search
USPC ................................................ 345/172–178
See application file for complete search history.

(56) References Cited

U.S. PATENT DOCUMENTS 8,164,588 B2 * 4/2012 Lauxtermann et al. ........ 345/214
8,232,972 B2 * 7/2012 Huang et al. .................. 345/173

(Continued)

FOREIGN PATENT DOCUMENTS

JP 51-113439 10/1976
JP 63-244922 A 10/1988

(Continued)

OTHER PUBLICATIONS

International Search Report and Written Opinion received for PCT Patent Application No. PCT/JP2010/001395, mailed on Jun. 15, 2010, 10 pages.

(Continued)

*Primary Examiner* — Alexander S Beck
*Assistant Examiner* — Sejoon Ahn
(74) *Attorney, Agent, or Firm* — Morrison & Foerster LLP

(57) ABSTRACT

The present invention achieves a display device capable of quick compensation of charging of parasitic capacitance with a simple configuration and low power consumption. The display device in accordance with the present invention includes (i) pixels, (ii) signal wires (Sj), and (iii) an operational amplifier (OP1) having a non-inverting input terminal connected with a corresponding signal wire (Sj). The operational amplifier (OP1) is configured such that: the non-inverting input terminal is connected with an output terminal (OUT) via a first impedance element (R1); an inverting input terminal is connected with the output terminal (OUT) via a second impedance element (R2); and the inverting input terminal is connected with a reference voltage terminal via a third impedance element (Cn). A value Zn of total impedance of pixels electrically connected with the corresponding signal wire, which impedance is obtained while the corresponding signal wire and the pixels electrically connected with the corresponding signal wire are being supplied with an image signal, is represented by $|Zn|<|Z1|\cdot|Z3|/|Z2|$, where Z1, Z2, and Z3 are values of impedance of the respective first through third impedance elements (R1, R2, and Cn).

14 Claims, 9 Drawing Sheets

(56) References Cited

U.S. PATENT DOCUMENTS

| | | | |
|---|---|---|---|
| 2002/0181697 A1 | 12/2002 | Bolla et al. |
| 2003/0001828 A1 | 1/2003 | Asano |
| 2003/0030602 A1 | 2/2003 | Kasai |
| 2004/0113873 A1 | 6/2004 | Shirasaki et al. |
| 2004/0201556 A1 | 10/2004 | Oomori et al. |
| 2005/0218821 A1 | 10/2005 | Asano |
| 2006/0114192 A1 | 6/2006 | Kasai |
| 2006/0208961 A1 | 9/2006 | Nathan et al. |
| 2008/0084411 A1 | 4/2008 | Oomori et al. |
| 2009/0079677 A1 | 3/2009 | Kasai |
| 2009/0135165 A1 | 5/2009 | Fukuzako et al. |

FOREIGN PATENT DOCUMENTS

| | | |
|---|---|---|
| JP | 3-86636 U | 9/1991 |
| JP | 2003-50564 A | 2/2003 |
| JP | 2003-114645 A | 4/2003 |
| JP | 2003-195810 A | 7/2003 |
| JP | 2004-309924 A | 11/2004 |
| JP | 2005-286516 A | 10/2005 |
| JP | 2008-530599 A | 8/2008 |
| JP | 2009-128756 A | 6/2009 |

OTHER PUBLICATIONS

Shim et al., "Acceleration of Current Programming Speed for AMOLED using Active Negative-Capacitance Circuit", IDW '07: Proceedings of The 14th International Display Workshops, vol. 3, Dec. 7, 2007, pp. 1985-1986.

Morosawa et al., "Stacked Source and Drain Structure for Micro Silicon TFT for Large Size OLED Display", IDW '07, AMD1-2, 2007, pp. 71-74.

Shim et al., "Fast Current-Programming Method to OLED", SID 08 Digest, 2008, pp. 105-108.

* cited by examiner

DISPLAY DEVICE

CROSS REFERENCE TO RELATED APPLICATIONS

This is a U.S. National Phase patent application of PCT/JP2010/001395, filed Mar. 2, 2010, which claims priority to Japanese Patent Application No. 2009-116642, filed May 13, 2009, each of which is hereby incorporated by reference in the present disclosure in its entirety.

TECHNICAL FIELD

The present invention relates to a display device.

BACKGROUND ART

When driving a light emitting element (i.e., a current element) to be controlled by a supplied current, such as an organic EL or a light emitting diode, it is necessary to control a minute electric current supplied to the current element. Out of these, regarding the organic EL, with an increase in efficiency of the organic EL, it has been required to accurately and quickly control a minute current supplied to the organic EL especially in a hold mode.

On the one hand there has been a large demand for lower power consumption and the efficiency of an organic EL element is expected to continue increasing, on the other hand development of TFTs has been rapidly carried out to achieve a high mobility. However, a definite drive method has not been developed, and demands for a higher definition image and increase in the number of gray scales are expected to increase in the future.

FIG. 10 is a circuit diagram illustrating a conventional drive circuit shown in Patent Literature 1. According to the drive circuit of FIG. 10, a gate electrode of a transistor 10 is connected with a scanning line Xi and a drain electrode of the transistor 10 is connected with a drain electrode of a transistor 12. The drain electrode of the transistor 12 is connected with a power line Vi, and a gate electrode of the transistor 12 is connected with a source electrode of the transistor 10. A source electrode of the transistor 12 is connected with a drain electrode of a transistor 11 and with an anode of an organic EL element Ei,j. A gate electrode of the transistor 11 is connected with the scanning line Xi, and a source electrode of the transistor 11 is connected with a signal line Yj.

During a selection period, a power signal voltage, which is equal to or lower than a reference potential Vss, is applied to the power line Vi. When the scanning line Xi goes into an H (high) state during the selection period, the transistors 10 through 12 go into an ON state. Further, a voltage applied across the organic EL element Ei,j becomes zero or a reverse bias. Accordingly, a programmed sink current Ij passes in a direction indicated by an arrow $\alpha$.

Since the transistor 12 goes into the ON state during the selection period, a gate-source voltage Vgs, which corresponds to drive performance of the transistor 12, is applied to a capacitor 13. This causes electric charge corresponding to the gate-source voltage Vgs to be stored in the capacitor 13.

After the end of the selection period, i.e., during a non-selection period during which the scanning line Xi is in an L (Low) state, a positive voltage is applied between the gate and source of the transistor 12 by the capacitor 13, which had been charged during the selection period. This causes only the transistor 12 to be in the ON state.

During the non-selection period, a power signal voltage applied to the power line Vi is a power supply voltage Vdd which is sufficiently higher than the reference potential Vss. Accordingly, a voltage, which is a forward bias, is applied to the organic EL element Ei,j, thereby allowing a constant current to pass through the organic EL element Ei,j.

Such a drive method is called a current programming method, which makes it possible to allow a constant current to pass through the organic EL element regardless of variation of TFTs of pixels.

CITATION LIST

Patent Literatures

Patent Literature 1

Japanese Patent Application Publication, Tokukai, No. 2003-195810 A (Publication Date: Jul. 9, 2003)

Patent Literature 2

Japanese Patent Application Publication, Tokukai, No. 2003-50564 A (Publication Date: Feb. 21, 2003)

Patent Literature 3

Japanese Patent Application Publication, Tokukai, No. 2004-309924 A (Nov. 4, 2004)

Non Patent Literatures

Non Patent Literature 1

Chang-Hoon Shim et al., "Fast Current-Programming Method to OLED", SID 08 DIGEST 9.4: Late-News Paper, pp 105-108

Non Patent Literature 2

N. Morosawa, et al., "Stacked Source and Drain Structure for Micro Silicon TFT for Large Size OLED Display", IDW'07 AMD1-2

SUMMARY OF INVENTION

Technical Problem

As described earlier, Patent Literature 1 provides a basic technique in which the organic EL element is driven by the current programming method. Note however that, in a display panel, wires which an electric current passes through, such wires as data signal lines and wires in pixel circuits, have parasitic capacitance. Therefore, it takes a long time to charge gate-source capacitance of a drive transistor such as the transistor 12 to a target voltage by a supplied constant voltage, because it is necessary to charge also the parasitic capacitance.

On the other hand, Non Patent Literature 1 teaches that a passive matrix or active matrix EL panel has negative capacitance. The negative capacitance supplies, to a signal line for supplying an electric current to an organic EL element OLED, an electric current $-C_n \cdot dV/dt$ that is proportional to a differential value found by time differentiation of a voltage of the signal line. The negative capacitance has a capacitance value that is a proportionality coefficient $-C_n$ of $-C_n \cdot dV/dt$. According to FIG. 11, the negative capacitance is formed by (a) an operational amplifier OP1 including a differentiation circuit which is constituted by a resistor $R_0$ and a capacitor $C_0$ and is connected to its non-inverting input terminal and (b) an operational amplifier OP2, including resistors $R_1$ and $R_2$, which amplifies an output voltage of the operational amplifier OP1. In response to the output voltage from the negative capacitance, an output of an auxiliary current source is controlled. The auxiliary current source is constituted by a variable resistor $R_3$ and a comparator OP3 whose output terminal is connected with a gate input of a switching transistor.

The negative capacitance causes parasitic capacitance $C_p$, which is formed between signal lines or in the pixel circuits, to be quickly charged. This makes it possible to cause a target constant current supplied to the organic EL element OLED to quickly settle into a steady state. FIG. 12(*a*) illustrates rising and falling edges of a waveform of a conventional set current. FIG. 12(*b*) illustrates rising and falling edges of a waveform of a set current obtained when the negative capacitance is used. According to FIG. 12(*b*), not only the rising and falling edges are sharp, but also a minute current reaches its steady state within a predetermined period.

Note however that, according to the configuration of FIG. 11, the auxiliary current source is capable of causing an electric current to flow only in a direction from a power supply $V_{ref}$ to the signal lines. Therefore, in a case where a voltage of the signal lines is to be reduced, it is necessary that the signal lines be connected to a low-voltage power supply by a reset pulse $V_{pulse}$.

As a result, a pre-charging, such as a pre-charging to a reset voltage or reset operation itself, is necessary before charging the parasitic capacitance by the auxiliary current source. This causes an increase in power consumption. Further, since the number of operation amplifiers is large, a circuit tends to have a complicated configuration.

Further, Patent Literature 1 discloses, as illustrated in FIG. 2 thereof, a technique in which a bypass current source is provided so as to cause more electric currents to pass through data lines and thus to increase a speed at which the parasitic capacitance is charged. However, the technique requires an additional bypass current source, and an unnecessary amount of electric currents are caused to flow and thus electric power consumption is increased.

Further, according to Patent Literature 3, (i) a timing control section and (ii) current writing means for writing an electric current other than a program current are provided so as to cause an electric current greater than the program current to flow during a predetermined period within a wiring period. Note however that, according to such a technique, how to control a timing or an auxiliary current supply should be changed depending on a previous state of data lines. This makes the configuration complicated. Further, a gate-source voltage of each drive transistor, while a constant current is flowing, differs from pixel to pixel due to variation in characteristics of drive transistors. This causes a problem in which a degree to which a delay in a writing time is compensated for varies from pixel to pixel due to the current writing means for writing the electric current other than the program current. It is extremely difficult to achieve such current writing means which accurately compensates also for variation of the drive transistors.

As has been described, a conventional display device employing a current programming method has a problem in which a configuration is complicated or power consumption is increased when compensation of charging of parasitic capacitance is to be carried out.

The present invention has been made in view of the problems, and an object of the present invention is to achieve a display device capable of quick compensation of charging of parasitic capacitance with a simple configuration and low power consumption.

Solution to Problem

In order to attain the above object, a display device in accordance with the present invention includes: a plurality of signal wires for supplying an image signal; a plurality of pixels in each of which an image is displayed in accordance with the image signal supplied from a corresponding one of the plurality of signal wires; at least one operational amplifier having (i) a non-inverting input terminal connected with a corresponding one of the plurality of signal wires, (ii) an inverting input terminal, and (iii) an output terminal; a first impedance element via which the non-inverting input terminal and the output terminal of said at least one operational amplifier are connected with each other; a second impedance element via which the inverting input terminal and the output terminal of said at least one operational amplifier are connected with each other; and a third impedance element via which the inverting input terminal of said at least one operational amplifier is connected with a reference voltage terminal, wherein, while (a) the corresponding one of the plurality of signal wires connected with the non-inverting input terminal and (b) pixels electrically connected with the corresponding one of the plurality of signal wires connected with the non-inverting input terminal are being supplied with the image signal, a value Zn of total impedance of the pixels electrically connected with the corresponding one of the plurality of signal wires connected with the non-inverting input terminal is represented by:

$$|Zn|<|Z1|\cdot|Z3|/|Z2|$$

where Z1 is a value of impedance of the first impedance element, Z2 is a value of impedance of the second impedance element, and Z3 is a value of impedance of the third impedance element.

According to the invention, it is possible to achieve negative capacitance with use of said at least one operational amplifier and first through third impedance elements.

The use of the negative capacitance allows for a quick response when parasitic capacitance is charged or discharged. This makes it possible to carry out, with a single circuit, both injecting and attracting of electric charge to/from the parasitic capacitance. As a result, a circuit to operate is reduced in size, thereby achieving a display device which consumes less electric power.

Further, a simple circuit configuration is achieved because no additional terminals are necessary for a panel. This is advantageous in terms of a reduction in a mounting area and a cost reduction.

As has been described, it is possible to achieve a display device capable of quick compensation of charging of parasitic capacitance with a simple configuration and low power consumption.

In order to attain the above object, a display device in accordance with the present invention includes: a plurality of signal wires for supplying an image signal; a plurality of pixels in each of which an image is displayed in accordance with the image signal supplied from a corresponding one of the plurality of signal wires; at least one operational amplifier having (i) an inverting input terminal connected with a corresponding one of the plurality of signal wires, (ii) a non-inverting input terminal, and (iii) an output terminal; a first impedance element via which the inverting input terminal and the output terminal of said at least one operational amplifier are connected with each other; a second impedance element via which the non-inverting input terminal and the output terminal of said at least one operational amplifier are connected with each other; and a third impedance element via which the non-inverting input terminal of said at least one operational amplifier is connected with a reference voltage terminal, wherein, while (a) the corresponding one of the plurality of signal wires connected with the inverting input terminal and (b) pixels electrically connected with the corresponding one of the plurality of signal wires connected with the inverting input terminal are being supplied with the image signal, a value Zn of total impedance of the pixels electrically connected with the corresponding one of the plurality of signal wires connected with the inverting input terminal is represented by:

$$|Zn|>|Z1|\cdot|Z3|/|Z2|$$

where Z1 is a value of impedance of the first impedance element, Z2 is a value of impedance of the second impedance element, and Z3 is a value of impedance of the third impedance element.

According to the invention, it is possible to achieve negative capacitance with use of said at least one operational amplifier and first through third impedance elements. This makes it possible to quickly charge, with a simple circuit configuration, parasitic capacitance connected with a wire.

Further, the use of the negative capacitance allows for a quick response when parasitic capacitance is charged or discharged. This makes it possible to carry out, with a single circuit, both injecting and attracting of electric charge to/from the parasitic capacitance. As a result, a circuit to operate is reduced in size, thereby achieving a display device which consumes less electric power.

As described above, it is possible to achieve a display device capable of quick compensation of charging of parasitic capacitance with a simple configuration and low power consumption.

Advantageous Effects of Invention

As described above, the display device in accordance with the present invention includes: a plurality of signal wires for supplying an image signal; a plurality of pixels in each of which an image is displayed in accordance with the image signal supplied from a corresponding one of the plurality of signal wires; at least one operational amplifier having (i) a non-inverting input terminal connected with a corresponding one of the plurality of signal wires, (ii) an inverting input terminal, and (iii) an output terminal; a first impedance element via which the non-inverting input terminal and the output terminal of said at least one operational amplifier are connected with each other; a second impedance element via which the inverting input terminal and the output terminal of said at least one operational amplifier are connected with each other; and a third impedance element via which the inverting input terminal of said at least one operational amplifier is connected with a reference voltage terminal, wherein, while (a) the corresponding one of the plurality of signal wires connected with the non-inverting input terminal and (b) pixels electrically connected with the corresponding one of the plurality of signal wires connected with the non-inverting input terminal are being supplied with the image signal, a value Zn of total impedance of the pixels electrically connected with the corresponding one of the plurality of signal wires connected with the non-inverting input terminal is represented by:

$$|Zn|<|Z1|\cdot|Z3|/|Z2|$$

where Z1 is a value of impedance of the first impedance element, Z2 is a value of impedance of the second impedance element, and Z3 is a value of impedance of the third impedance element.

Further, as described above, the display device in accordance with the present invention includes: a plurality of signal wires for supplying an image signal; a plurality of pixels in each of which an image is displayed in accordance with the image signal supplied from a corresponding one of the plurality of signal wires; at least one operational amplifier having (i) an inverting input terminal connected with a corresponding one of the plurality of signal wires, (ii) a non-inverting input terminal, and (iii) an output terminal; a first impedance element via which the inverting input terminal and the output terminal of said at least one operational amplifier are connected with each other; a second impedance element via which the non-inverting input terminal and the output terminal of said at least one operational amplifier are connected with each other; and a third impedance element via which the non-inverting input terminal of said at least one operational amplifier is connected with a reference voltage terminal, wherein, while (a) the corresponding one of the plurality of signal wires connected with the inverting input terminal and (b) pixels electrically connected with the corresponding one of the plurality of signal wires connected with the inverting input terminal are being supplied with the image signal, a value Zn of total impedance of the pixels electrically connected with the corresponding one of the plurality of signal wires connected with the inverting input terminal is represented by:

$$|Zn|>|Z1|\cdot|Z3|/|Z2|$$

where Z1 is a value of impedance of the first impedance element, Z2 is a value of impedance of the second impedance element, and Z3 is a value of impedance of the third impedance element.

This makes it possible to achieve a display device capable of quick compensation of charging of parasitic capacitance with a simple configuration and low power consumption.

BRIEF DESCRIPTION OF DRAWINGS

FIG. 2 is used, is a waveform chart illustrating a current waveform and a waveform of an electric potential.

FIG. 12(*a*) illustrates a current waveform obtained in a case where the negative capacitance of FIG. 11 is not used. FIG. 12(*b*) illustrates a current waveform obtained in a case where the negative capacitance of FIG. 11 is used.

DESCRIPTION OF EMBODIMENTS

Embodiments 1 through 4 of the present invention are described below with reference to FIGS. 1 through 9. The following description discusses how a display device 1 of embodiments of the present invention is configured.

Figure 4:
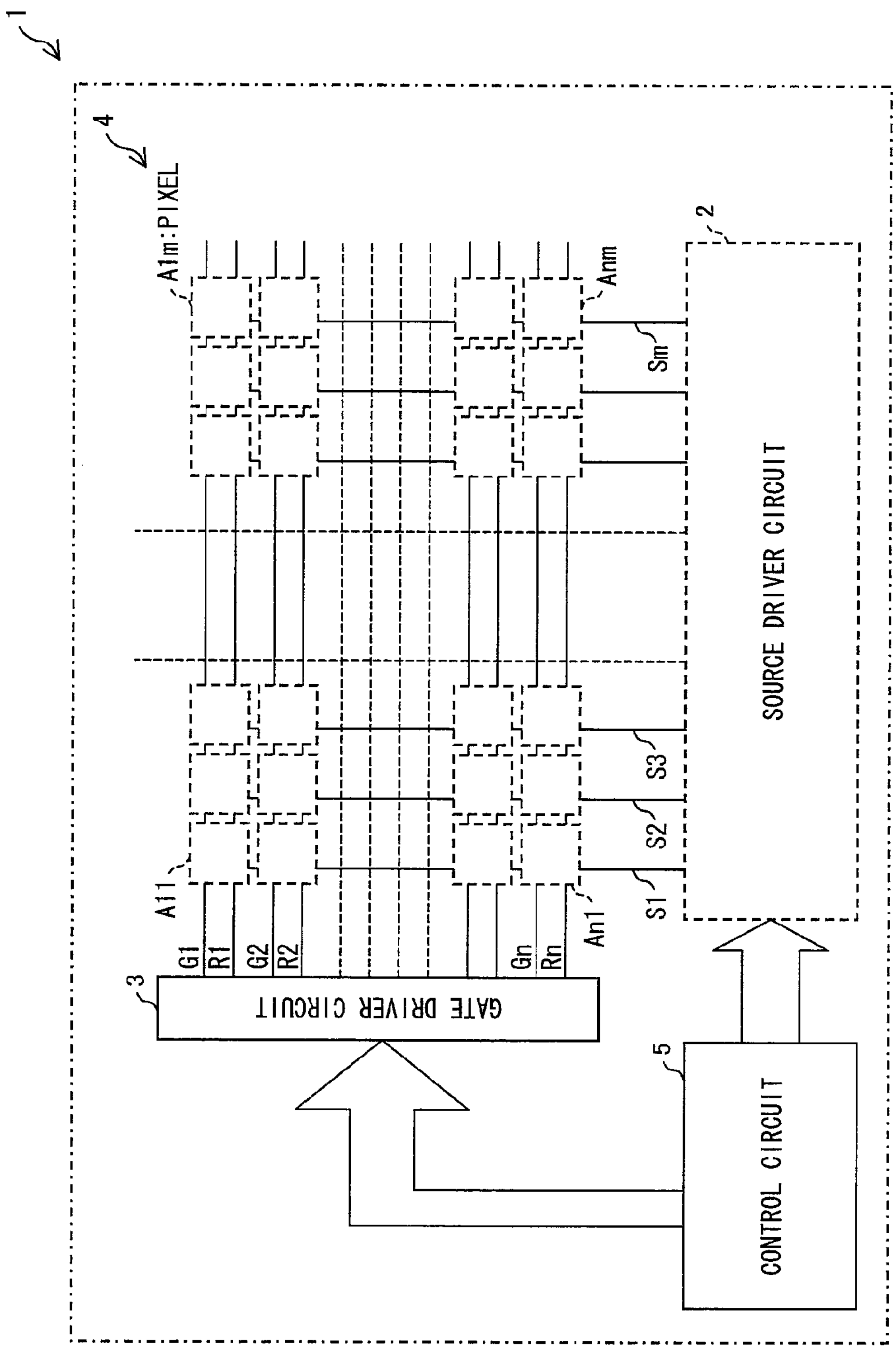
FIG. 4, showing embodiments of the present invention, is a block diagram illustrating how a display device is configured.

FIG. 4 is a block diagram illustrating how a display device 1 of the embodiments is configured. The display device 1 is an active matrix organic EL display device, which includes (i) a source driver circuit 2 which drives a plurality of data signal lines (m data signal lines, signal wires) S1, S2, . . . and Sm, (ii) a gate driver circuit 3 which controls a plurality of scanning lines (n scanning lines) G1, G2, . . . and Gn and a plurality of scanning lines (n scanning lines) R1, R2, . . . and Rn, (iii) a display section 4 having a plurality of pixels (m×n pixels) A11, . . . , A1*m*, . . . , An1, . . . , and Anm, and (iv) a control circuit 5 which controls the source driver circuit 2 and the gate driver circuit 3.

The source driver circuit 2 includes a shift register, a data latch section, and a switch section. The source driver circuit 2 supplies, to a data signal line corresponding to pixels that belong to a column being selected, an image signal including a voltage signal or a current signal. The gate driver circuit 3 includes, like the source driver circuit 2, a shift register, a data latch section, and a switch section. The gate driver circuit 3 controls the plurality of scanning lines G1, G2, . . . and Gn and the plurality of scanning lines R1, R2, . . . and Rn. Further, the gate driver circuit 3 supplies a control signal to each selected line. The control circuit 5 outputs a control clock and a start pulse etc. The shift register of the source driver circuit 2 and the shift register of the gate driver circuit 3 supply signals for selecting a column and a line.

The display section 4 of the display device 1 includes (i) the plurality of scanning lines (n scanning lines) G1 through Gn, (ii) the plurality of data signal lines (m data signal lines) S1 through Sm which intersect the plurality of scanning lines G1 through Gn, and (iii) the plurality of pixels (m×n pixels) A11, . . . , A1*m*, . . . , An1, . . . , and Anm which are provided so as to correspond to respective intersections of the plurality of scanning lines G1 through Gn and the plurality of data signal lines S1 through Sm. The plurality of pixels can be picture elements. The plurality of pixels A11, . . . , A1*m*, . . . , An1, . . . , and Anm are arranged in a matrix manner so as to form pixel array. Hereinafter, a direction of the pixel array in which the plurality of scanning lines extend is referred to as a line direction, whereas a direction of the pixel array in which the plurality of data signal lines extend is referred to as a column direction.

Figure 2:
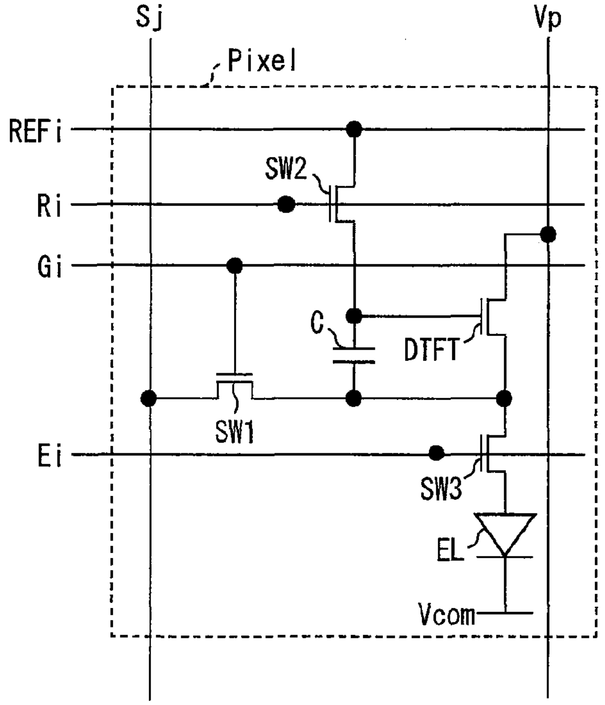
FIG. 2, showing the embodiment of the present invention, is a circuit diagram illustrating how a pixel circuit is configured.

The following description discusses, with reference to FIG. 2, how a pixel circuit Pixel of each pixel Aij (i=1 through n, j=1 through m) is configured.

The pixel circuit Pixel is provided at an intersection of (i) a scanning line Gi and a scanning line Ri (each of which is an i-th line to be selected) and (ii) a data signal line Sj (which is a j-th column). Further, a reference potential line REFi and a control line Ei are provided for the i-th line. A power line Vp is provided for the j-th column or every plurality of columns.

The pixel circuit Pixel includes (i) an organic light emitting diode EL, which is an element that emits light having luminance corresponding to a current passing therethrough, (ii) a drive transistor DTFT, (iii) switching elements SW1, SW2, and SW3, and (iv) a capacitor C. The drive transistor DTFT and the switching elements SW1, SW2, and SW3 used here are all N-channel thin film transistors. Note, however, that these can be P-channel thin film transistors or transistors of different kinds. In a case where these are N-channel thin film transistors, it is possible for the display device 1 to use an amorphous silicon panel from which it is difficult to make P-channel thin film transistors.

In the pixel circuit Pixel, a gate of the switching element SW1, which gate is a terminal for controlling conducting and blocking states of the switching element SW1, is connected with the scanning line Gi. A gate of the switching element SW2, which gate is a terminal for controlling conducing and blocking states of the switching element SW2, is connected with the scanning line Ri. A gate of the switching element SW3, which gate is a terminal for controlling conducting and blocking states of the switching element SW3, is connected with a control line Ei. A gate of the drive transistor DTFT, which gate is a terminal for controlling an electric current, is connected with one terminal (source) of the switching element SW2 and one terminal of the capacitor C. A drain of the drive transistor DTFT is connected with the power line Vp.

A source of the drive transistor DTFT is connected with (i) one terminal (drain) of the switching element SW1, (ii) the other terminal of the capacitor C, and (iii) a drain of the switching element SW3. A source of the switching element SW3 is connected with an anode of the organic light emitting diode EL. A source of the switching element SW1 is connected with the data signal line Sj. The other terminal (drain) of the switching element SW2 is connected with the reference potential line REFi.

Further, a cathode of the organic light emitting diode EL is electrically grounded to a common electric potential Vcom.

Figure 3:
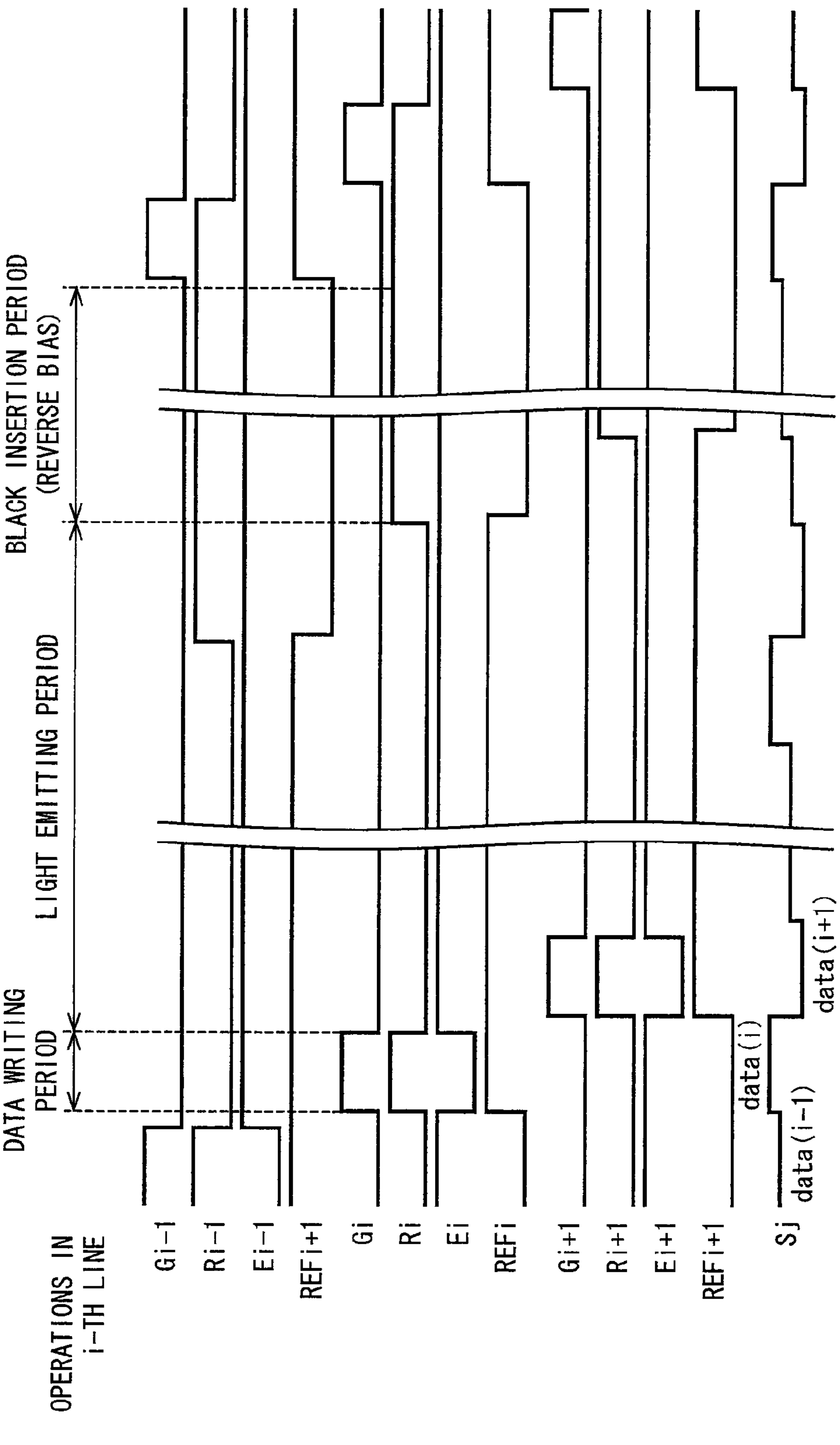
FIG. 3 is a timing chart illustrating how the pixel circuit of FIG. 2 is driven.

The following description discusses, with reference to FIG. 3, processes of driving the pixel circuit Pixel having the above configuration.

First, at a start of a data writing period, the scanning lines Gi and Ri become High and the control line Ei becomes Low. At the same time, the reference potential line REFi becomes High.

Accordingly, the switching elements SW1 and SW2 become conductive, thereby allowing a constant current corresponding to an electric potential of data (i), which current serves as an image signal caused to flow from the source driver circuit 2 by a constant current circuit, to pass through the power line Vp, the drive transistor DTFT, the switching element SW1, and the data signal line Sj. As a result, a gate-source voltage corresponding to the constant current is applied to the capacitor C.

Next, at a start of a light emitting period, the scanning lines Gi and Ri become Low and the control line Ei becomes High. The reference potential line REFi remains at High. Accordingly, the switching elements SW1 and SW2 are in a blocking state. The gate of the drive transistor DTFT becomes floating, and a gate electric potential varies according to an electric potential of the source so that the gate-source voltage keeps constant. During the light emitting period, an electric charge corresponding to an electric potential of written data is retained in the capacitor C like above, thereby allowing a drive current to pass through the organic light emitting diode EL via the switching element SW3 which is in the conducting state. The organic light emitting diode EL emits light having luminance corresponding to the current passing therethrough.

Next, at a start of a black insertion period, the scanning line Ri becomes High and the reference potential line REFi becomes Low. Since the reference potential line REFi becomes Low, the gate-source voltage of the drive transistor DTFT becomes a reverse bias, thereby causing the drive transistor DTFT to be in the blocking state. As a result, no electric current passes through the organic light emitting diode EL, thereby causing a black display. Such a configuration in which the black insertion period is provided is a technique for avoiding, when trying to achieve identical luminance over one (1) frame, difficulty of controlling a minute electric current by shortening the light emitting period and increasing an electric current caused to flow during the light emitting period.

Further, the gate-source voltage of the drive transistor DTFT has a negative value during the black insertion period. This suppresses shift of a threshold voltage of the drive transistor DTFT. As described in Non Patent Literature 2, it has been generally known that, if a DC bias keeps being applied to a gate of a non crystalline thin film transistor, a threshold voltage is shifted in a positive direction. In order to prevent this, a method of suppressing the shift of the threshold voltage by applying a reverse bias having an absolute value substantially equal to that of the DC bias has been employed.

The following description discusses, with embodiments, how an output section of the source driver circuit 2 is configured.

Embodiment 1

Figure 1:
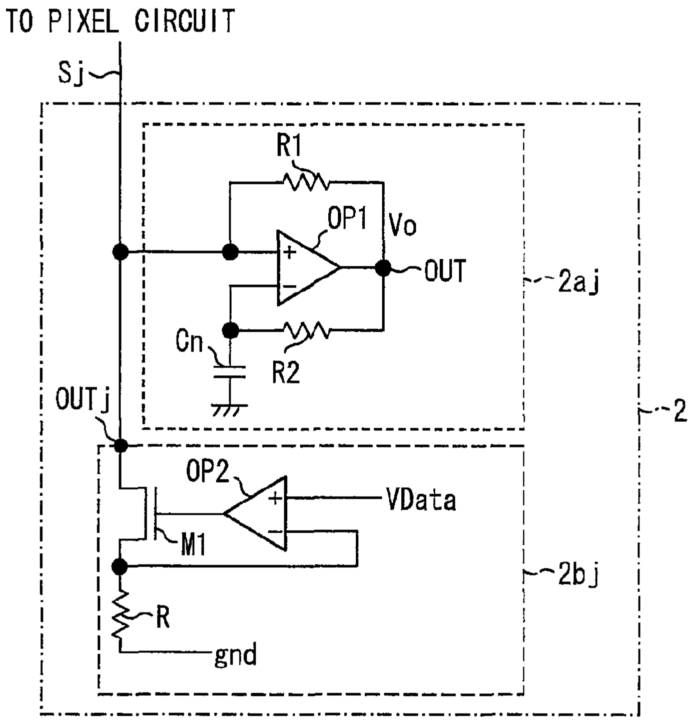
FIG. 1, showing an embodiment of the present invention, is a circuit diagram illustrating how an output section of a source driver circuit of a first embodiment is configured.

FIG. 1 illustrates how the output section of the source driver circuit 2 of the present embodiment is configured.

The output section includes, for each column (i.e., for each data signal line Sj), a negative capacitance circuit 2*aj* and a constant current circuit 2*bj*.

The negative capacitance circuit 2*aj* includes an operational amplifier OP1, resistors (resistor elements) R1 and R2, and a capacitor (capacitor element) Cn.

A non-inverting input terminal of the operational amplifier OP1 is connected with a corresponding data signal line Sj. Note here that, although the non-inverting input terminal is directly connected with the data signal line Sj, another element can be provided between the non-inverting input terminal and the data signal line Sj. Further, although the present embodiment describes with an example in which the operational amplifier OP1 is connected to each data signal line Sj, the operational amplifier OP1 can be connected only to one or each of some data signal line(s) for which the later-described effect is desired.

The non-inverting input terminal of the operational amplifier OP1 is connected with an output terminal OUT via the resistor R1 serving as an impedance element (first impedance element) Z1. An inverting input terminal of the operation amplifier OP1 is connected with the output terminal OUT via the resistor R2 serving as an impedance element (second impedance element) Z2. The inverting input terminal of the operational amplifier OP1 is connected with a reference voltage terminal gnd via the capacitor Cn serving as an impedance element (third impedance element) Z3. Note that, although the reference voltage terminal used here is a grounding terminal, the reference voltage terminal can be a terminal having an electric potential set as appropriate. The impedance element Z1 and the impedance element Z2 are resistor elements, which are of the same kind.

Let (i) Vsj be an electric potential of the data signal line Sj, (ii) Vo be an electric potential of the output terminal OUT, (iii) Iin be an electric current flowing from an input terminal (which is the non-inverting input terminal here) of the operational amplifier OP1 which terminal is connected with the data signal line Sj toward the output terminal OUT via the impedance element Z1, and (iv) each of Z1, Z2, and Z3 be impedance of a corresponding one of the impedance elements Z1, Z2, and Z3. Then, the Vo and Iin are represented by the following equations:

$$Vo=\{(Z2+Z3)/Z3\}\times Vsj$$

$$Iin=(Vsj-Vo)/Z1$$

Accordingly, $$Iin=\{-Z2/(Z1\cdot Z3)\}\times Vsj$$

As such, a value Zin of input impedance is represented as follows:

$$Zin=-(Z1/Z2)\times Z3$$

In this case, a condition of stability of such a system is represented as follows:

$$|Zn|<|Zin|$$

that is, $$|Zn|<|Z1|\cdot|Z3|/|Z2|$$

where, Zn is a value of total impedance of pixels electrically connected with a data signal line Sj, which impedance is obtained while the data signal line Sj and the pixels electrically connected with the data signal line Sj are being supplied with an image signal.

Note here that, in a case where Z1/Z2 is a dimensionless quantity and Z3 is capacitance, it is possible to achieve Zin serving as negative capacitance. In a case of FIG. 1, the negative capacitance is represented by the following equation:

$$\text{Negative capacitance}=-(R2/R1)\times Cn$$

Let (i) R1 and R2 be values of resistance of the resistors R1 and R2, respectively, (ii) Cn be a value of capacitance of the capacitor Cn, and (iii) Cp be a value of a sum of capacitance of the data signal line Sj and parasitic capacitance connected with the data signal line Sj. Then, it is possible to achieve a condition (condition of stability of the system) in which the Vo is a negative voltage, i.e., a condition for achieving negative feedback, when the following inequality is satisfied:

$$Cp>(R2/R1)\times Cn \quad (1)$$

According to the present embodiment, it is possible to easily achieve the negative capacitance capable of stable operation, by using the resistor elements and the capacitor element. The parasitic capacitance Cp is a sum of floating capacitance of the data signal line Sj and capacitance of corresponding pixel circuits Pixel . . . . The value of the negative capacitance is limited by the inequality (1); however, for the purpose of reducing a time taken for charging the parasitic capacitance, the value of the negative capacitance is preferably as close as possible to the Cp while satisfying the inequality (1). The floating capacitance of the data signal line Sj is found from (i) a size of an area where the data signal line Sj and another wire intersecting the data signal line Sj overlap each other, (ii) a thickness of an interlayer film, and (iii) a dielectric constant of the interlayer film. The capacitance of the pixel circuit Pixel is, in a case of FIG. 2, a sum of the following:

(1) Pixel capacitance C;

(2) Capacitance of the drive transistor DTFT and capacitance of the switching element SW1; and (3) Series capacitance of the switching element SW3 and the organic light emitting diode EL.

In a case where a pixel is in a non-selected state, parasitic capacitance between the gate and source (drain) of the switching element SW1 only contributes to the floating capacitance of the data signal line Sj.

In a case of a passive matrix, capacitance of the pixel circuit is a sum of capacitance of all pixels connected with the data signal line Sj.

Since the negative capacitance circuit 2*aj* is used as the negative capacitance like above, the negative capacitance circuit 2*aj* serves as a parasitic capacitance cancel circuit.

As described earlier, the values of the R1, R2, and Cn can be set freely provided that the inequality (1) is satisfied. Note here that, in a case where R2>R1, i.e., |Z2|>|Z1|, it is possible for the Cn to have a smaller value. This makes it possible to reduce a layout area for the Cn, thereby achieving a driver having a smaller area.

Further, the constant current circuit 2*bj* includes a resistor (first resistor) R, a comparator OP2, and a switching element (first switch) M1.

One end of the resistor R is connected with a power supply gnd. A non-inverting input terminal (first input terminal) of the comparator OP2 receives a data electric potential VData corresponding to a value of an electric current caused to pass through the data signal line Sj, and an inverting input terminal (second input terminal) of the comparator OP2 receives an electric potential of the other terminal of the resistor R. The switching element M1 used here is an N-channel thin film transistor. The switching element M1 is connected between the other terminal of the resistor R and an output terminal OUTj of the constant current circuit 2*bj*. A gate of the switching element M1, which gate is a terminal for controlling conducting and blocking states of the switching element M1, is connected with an output terminal of the comparator OP2.

The constant current circuit 2*bj* configured like above (i) compares the data electric potential VData with the electric potential, of the other terminal of the resistor R, which is caused by a voltage drop of the resistor R and (ii) repeats switching of the switching element M1 so as to equalize the data electric potential VData and the electric potential of the other terminal of the resistor R. This causes the output terminal OUTi to output a constant current (i.e., an electric current found by dividing a voltage effect of the resistor R by R) corresponding to the data electric potential VData.

Figure 5:
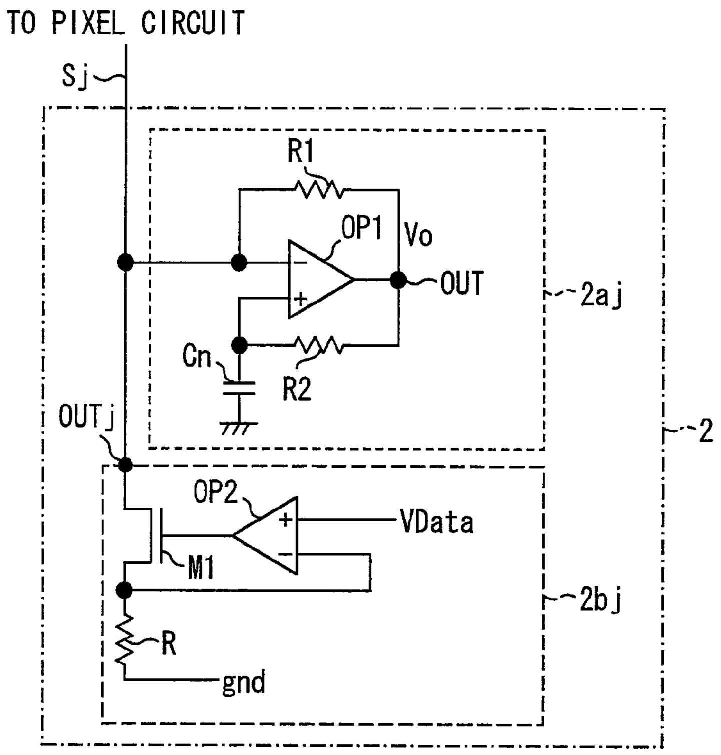
FIG. 5 is a circuit diagram illustrating a configuration of a modification of the output section of FIG. 1.

FIG. 5 illustrates a circuit in which the non-inverting input terminal and the inverting input terminal are exchanged in a differential amplifier of the operational amplifier OP1 of FIG. 1.

In a case of the circuit of FIG. 5, a condition (condition of stability of a system) for achieving negative feedback is as follows:

$$|Zn|>|Zin|$$

that is, $$|Zn|>|Z1|\cdot|Z3|/|Z2|$$

accordingly, $$Cp<(R2/R1)\times Cn \quad (2)$$

That is, the negative capacitance having an absolute value greater than that of the Cp is achieved. The value of the negative capacitance is limited by the inequality (2); however, for the purpose of reducing a time taken for charging parasitic capacitance, the value of the negative capacitance is preferably as close as possible to the Cp while satisfying the inequality (2). Note here that, in a case where R2>R1, i.e., |Z2|>|Z1|, it is possible to reduce a layout area of the Cn, thereby achieving a driver having a smaller area.

Note that, in the foregoing examples, appropriate phase compensation capacitance can be provided in the operational amplifier OP1 so as to prevent oscillation. This is a generally known design matter. The value of the phase compensation capacitance is preferably designed appropriately because the value is related to a trade-off relationship between a slew rate and electric power consumption.

Figure 6:
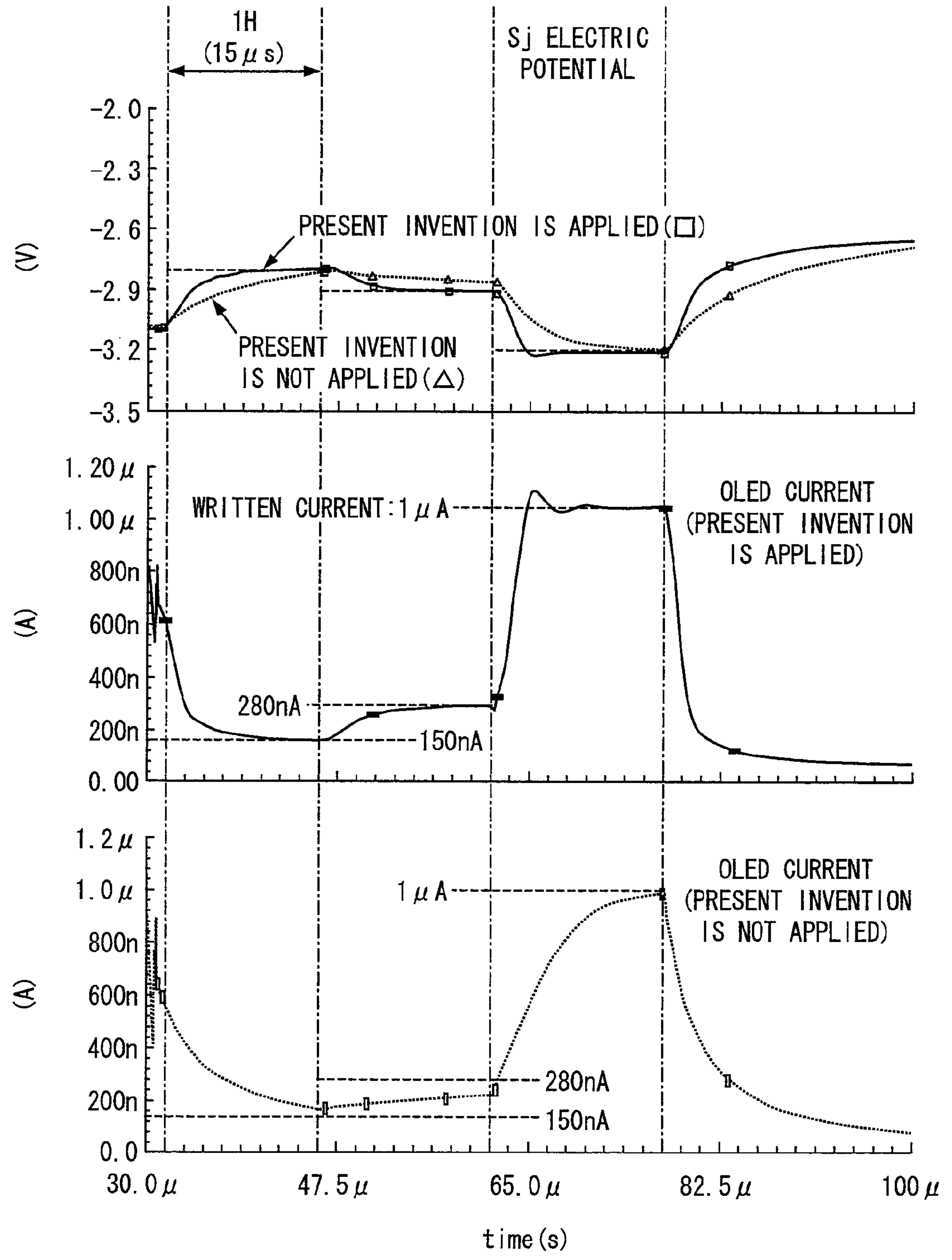
FIG. 6, showing an effect achieved when the output section of FIG. 1

FIG. 6 shows an effect of the present embodiment.

An OLED current in the middle part of FIG. 6 shows a waveform of an electric current written to the pixel circuit Pixel according to the present embodiment. An OLED current at the lower part of FIG. 6 shows a waveform of an electric current written to the pixel circuit Pixel from a conventional current source alone. Further, waveforms of electric potentials of the data signal line Sj, which waveforms are illustrated at the upper part of FIG. 6, are a waveform obtained in a case of the present embodiment and a waveform obtained in a case of the conventional current supply alone. A program current is 150 nA in the first column, 280 μA in the second column, and 1 μA in the third column. Assume that values of parasitic capacitance and parasitic resistance of wires are 10 pF and 3 kΩ, respectively, and capacitance of each pixel is 1 pF. A simulation is carried out such that one horizontal period (1H) is 15 μs when a panel having divisions divided by 1080 lines is driven with 60 Hz, on the assumption that each configuration is applied to a HD-TV (high-definition television).

In a case of a conventional configuration in which the present embodiment is not employed, an electric current of the order of several hundreds nA is used for charging parasitic capacitance. As a result, it is not possible to write an electric current as a light emission current within a writing period. Further, also in a case where a voltage of the data signal line Sj changes dramatically, e.g., in a case where an electric current changes from 280 nA to 1 μA, the writing period is not sufficient.

On the other hand, in a case where the present embodiment is employed, the parasitic capacitance is charged by the negative capacitance circuit 2*aj*. Accordingly, it is possible to quickly write a program current. This is clear from FIG. 6, in which a rising edge and a falling edge of the waveform of the OLED current in the middle part are more sharp than those of the waveform of the OLED current in the lower part. That is, this means that providing negative capacitance having a simple configuration makes it possible to reduce a program time. This is advantageous for achieving a display panel with higher definition, a display panel with higher image quality (e.g., double-speed driving), a larger display panel, or the like.

Further, as is clear from the fact that the falling edge of the waveform of the OLED current in the middle part is sharp, the negative capacitance circuit 2*aj* of the present embodiment allows for a quick response not only when the parasitic capacitance of the data signal line Sj is charged (electric potential is injected to the parasitic capacitance) but also when the parasitic capacitance is discharged (electric potential is attracted from the parasitic capacitance). That is, it is possible to quickly write a data signal to each pixel regardless of a previous state of a data line.

Further, in a case where the constant current circuit for supplying a signal current to each data signal line is provided like the display device 1 of the present embodiment and other embodiments, it is possible to dramatically reduce delay in a data writing time in a display device which carries out an electric current programming that makes it possible to supply a drive current not affected by variation of drive transistors of pixels to a light emitting element. This makes it possible to achieve a large and high-definition display device.

Embodiment 2

Figure 7:
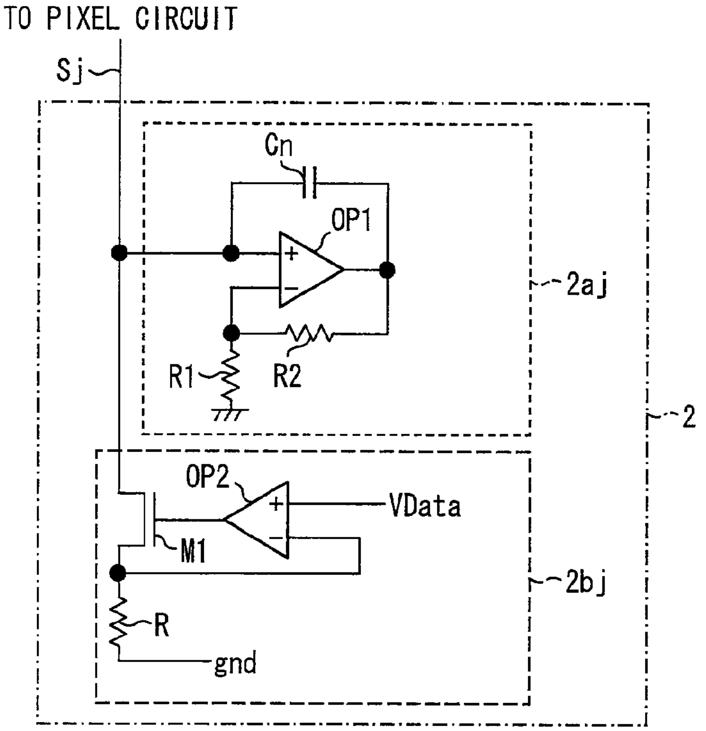
FIG. 7, showing another embodiment of the present invention, is a circuit diagram illustrating how an output section of a source driver circuit of a second embodiment is configured.

FIG. 7 illustrates how an output section of the source driver circuit 2 of the present embodiment is configured.

The output section is different from the configuration of FIG. 1 in that the impedance element Z1 is a capacitor Cn, the impedance element Z2 is a resistor R2, and the impedance element Z3 is a resistor R1. The impedance element Z2 and the impedance element Z3 are resistor elements, which are of the same kind.

In this case, input impedance is represented, in the similar manner to Embodiment 1, by the following equation:

$$Zin=-((1/j\omega Cn)/R2)\times R1$$

accordingly, the following negative capacitance is obtained:

$$\text{Negative capacitance}=-(R2/R1)\times Cn \quad (3)$$

In this case, a condition (condition of stability of a system) for achieving negative feedback is as follows:

$$|Zn|<|Zin|$$

that is, $$Cp>(R2/R1)\times Cn$$

where, Zn is a value of total impedance of pixels electrically connected with a data signal line Sj, which impedance is obtained while the data signal line Sj and the pixels electrically connected with the data signal line Sj are being supplied with an image signal.

According to the present embodiment, it is possible to easily achieve the negative capacitance capable of stable operation, by using the resistor elements and the capacitor element. The value of the negative capacitance is limited by the inequality (3); however, for the purpose of reducing a time taken for charging parasitic capacitance, the value of the negative capacitance is preferably as close as possible to the Cp while satisfying the inequality (3). Note here that, in a case where R2>R1, i.e., |Z2|>|Z3|, it is possible to reduce a layout area of the Cn, thereby achieving a driver having a smaller area.

The present embodiment also achieves an effect equivalent to that of Embodiment 1. In addition, according to the present embodiment, a capacitor is provided on a feedback path instead of a resistor. Accordingly, even if trouble occurs in the differential amplifier of the operation amplifier OP1, it is possible to prevent output of the operational amplifier OP1 from being supplied directly to the data signal line Sj.

Further, in a case where the non-inverting input terminal and the inverting input terminal of the differential amplifier of the operational amplifier OP1 are exchanged as illustrated in FIG. 2, a condition (condition of stability of a system) for achieving negative feedback is as follows:

$$|Zn|>|Zin|$$

that is, $$Cp<(R2/R1)\times Cn \quad (4)$$

The value of the negative capacitance is limited by the inequality (4); however, for the purpose of reducing a time taken for charging parasitic capacitance, the value of the negative capacitance is preferably as close as possible to the Cp while satisfying the inequality (4).

Embodiment 3

Figure 8:
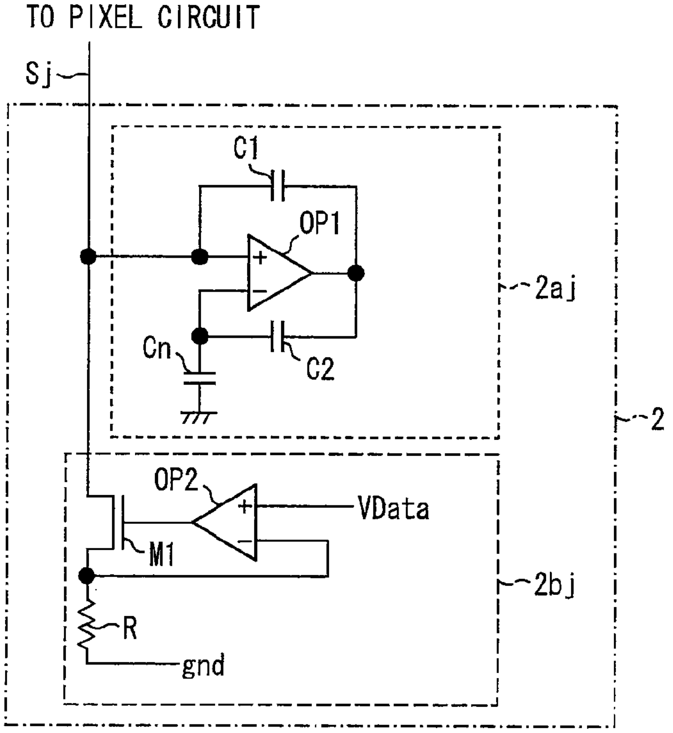
FIG. 8, showing a further embodiment of the present invention, is a circuit diagram illustrating how an output section of a source driver circuit of a third embodiment is configured.

FIG. 8 illustrates how an output section of the source driver circuit 2 of the present embodiment is configured.

The output section is different from the configuration of FIG. 1 in that the impedance element Z1 is a capacitor C1, the impedance element Z2 is a capacitor C2, and the impedance element Z3 is a capacitor Cn. The impedance element Z1 and the impedance element Z2 are capacitor elements, which are of the same kind. The impedance element Z2 and the impedance element Z3 are capacitor elements, which are of the same kind.

In this case, the following negative capacitance is obtained in the similar manner to Embodiment 1:

$$\text{Negative capacitance}=-(C1/C2)\times Cn \quad (5)$$

In this case, a condition (condition of stability of a system) for achieving negative feedback is as follows:

$$|Zn|<|Zin|$$

that is, $$Cp>(C1/C2)\times Cn$$

where, Zn is a value of total impedance of pixels electrically connected with a data signal line Sj, which impedance is obtained while the data signal line Sj and the pixels electrically connected with the data signal line Sj are being supplied with an image signal.

According to the present embodiment, it is possible to easily achieve the negative capacitance capable of stable operation, by using the capacitor elements. The value of the negative capacitance is limited by the inequality (5); however, for the purpose of reducing a time taken for charging parasitic capacitance, the value of the negative capacitance is preferably as close as possible to the Cp while satisfying the inequality (5). Note here that, in a case where C1>C2, i.e., |Z2|>|Z1|, it is possible to reduce a layout area of the Cn, thereby achieving a driver having a smaller area. The same effect can be achieved in a case where Cn>C2, i.e., |Z2|>|Z3|.

The present embodiment also achieves an effect equivalent to that of Embodiment 1. In addition, according to the present embodiment, a capacitor is provided on a feedback path instead of a resistor. Accordingly, even if trouble occurs in the differential amplifier of the operation amplifier OP1, it is possible to prevent output of the operational amplifier OP1 from being supplied directly to the data signal line Sj.

Further, since the impedance elements Z1, Z2, and Z3 are not resistors but capacitors having element values more accurate than those of the resistors, it is possible to reduce variation in values of the negative capacitance.

Further, in a case where the non-inverting input terminal and the inverting input terminal of the differential amplifier of the operational amplifier OP1 are exchanged as illustrated in FIG. 2, a condition (condition of stability of a system) for achieving negative feedback is as follows:

$$|Zn|>|Zin|$$

that is, $$Cp<(C1/C2)\times Cn \quad (6)$$

The value of the negative capacitance is limited by the inequality (6); however, for the purpose of reducing a time taken for charging parasitic capacitance, the value of the negative capacitance is preferably as close as possible to the Cp while satisfying the inequality (6).

Embodiment 4

Figure 9:
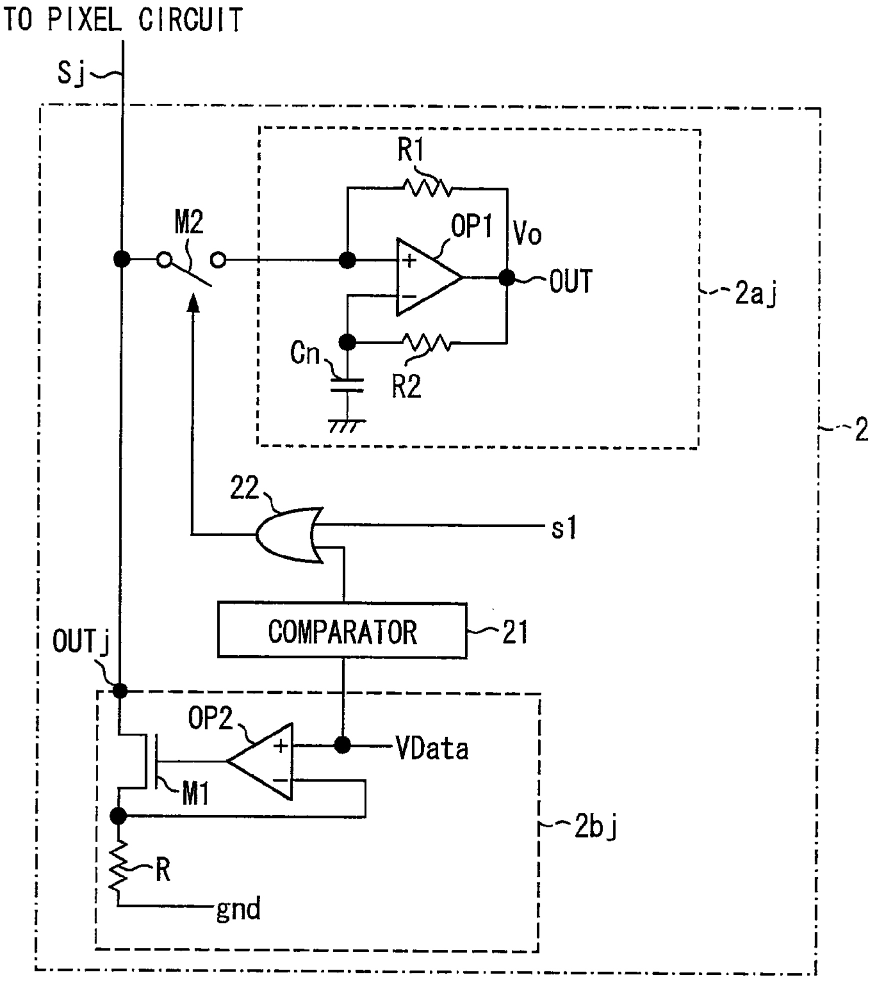
FIG. 9, showing still a further embodiment of the present invention, is a circuit diagram illustrating how an output section of a source driver circuit of a fourth embodiment is configured.
Figure 10:
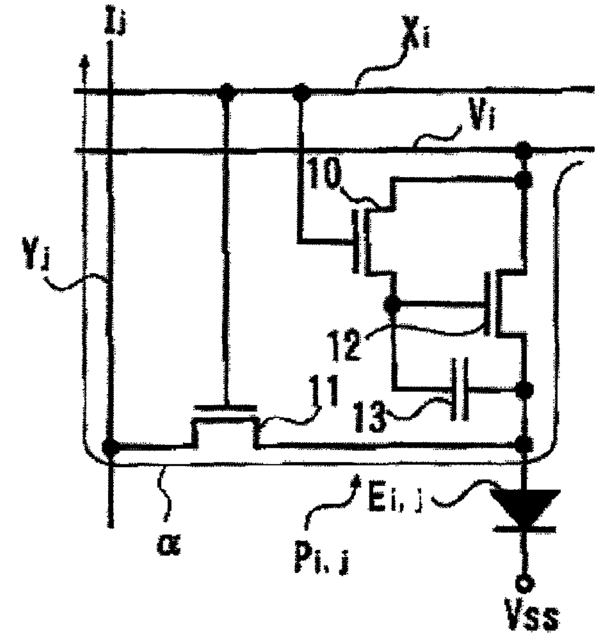
FIG. 10, showing a conventional art, is a circuit diagram illustrating how a pixel circuit is configured.
Figure 11:
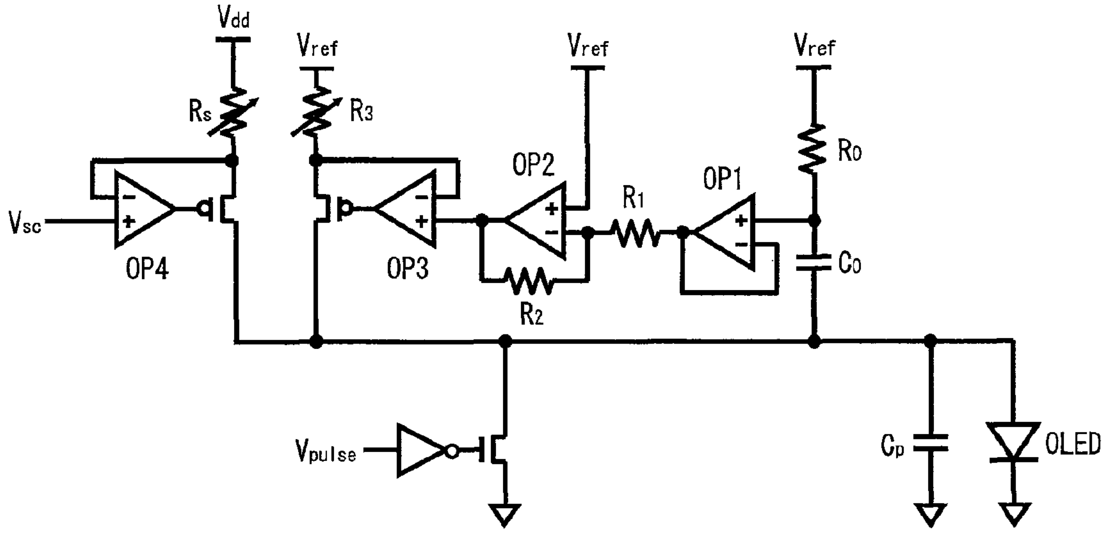
FIG. 11, showing a conventional art, is a circuit diagram illustrating how negative capacitance is formed.
Figure 12:
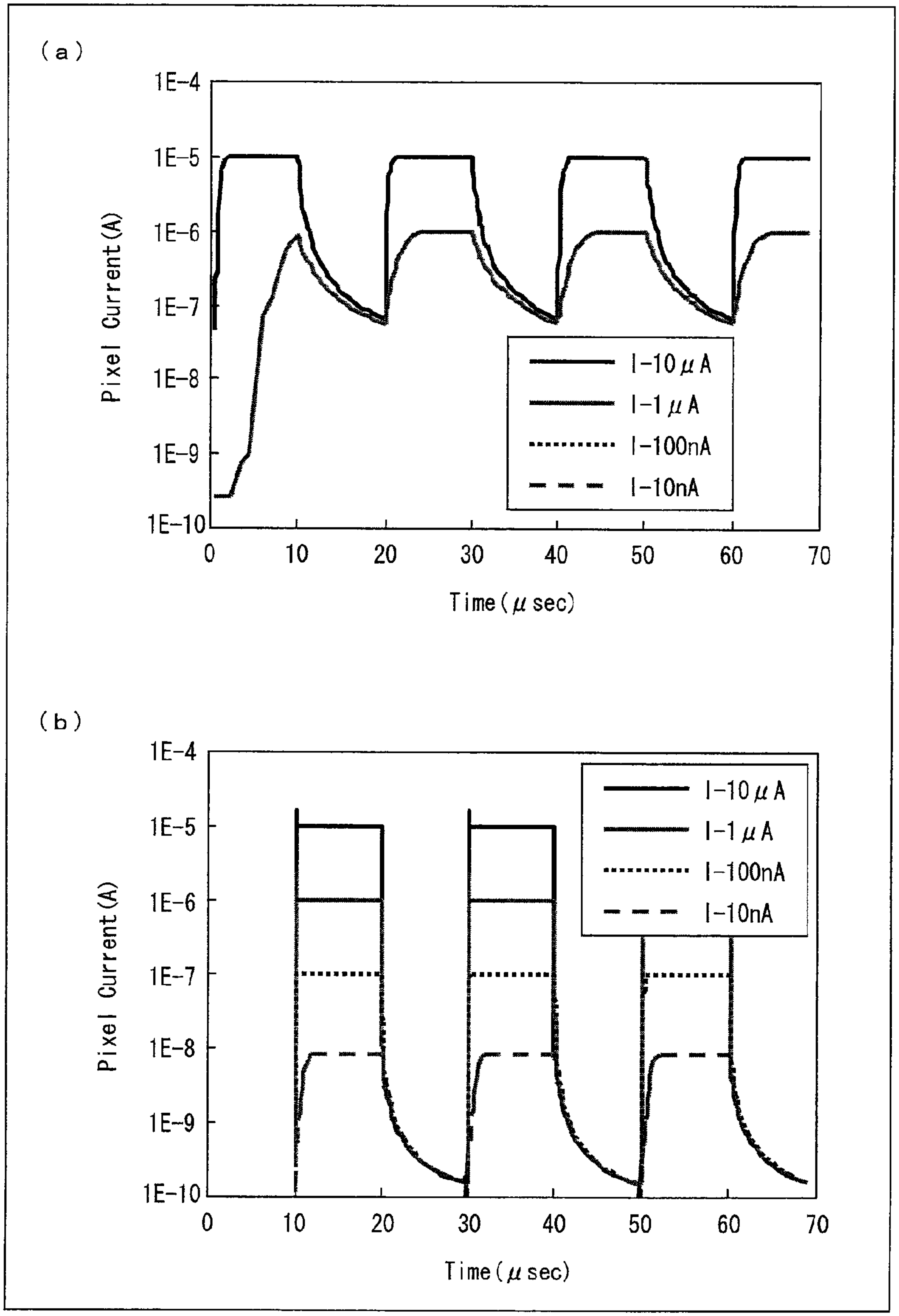
FIG. 12 is a waveform chart showing a conventional art.

FIG. 9 illustrates how an output section of the source driver circuit 2 of the present embodiment is configured.

The output section of FIG. 9 is different from the output section of FIG. 1 in that the output section of FIG. 9 further includes a switch (second switch) M2, a comparator 21, and an OR circuit 22 having two input terminals. An input terminal (in FIG. 1, the non-inverting input terminal) of the operational amplifier OP1, which terminal is to be connected with the data signal line Sj, is connected with the data signal line Sj via the switch M2.

The switch M2 receives, via a terminal (e.g., a gate of a thin film transistor) for controlling conducting and blocking states of the switch M2, a data electric potential VData or a signal corresponding to an external control signal s1. Note here that the data electric potential VData is supplied to the comparator 21, which (i) compares the data electric potential VData with a reference potential so as to determine whether or not the data electric potential VData falls within a range in which an electric current not greater than a predetermined value is caused to pass through the data signal line Sj and (ii) outputs a result of the comparison. The result is supplied to one of the two input terminals of the OR circuit 22, whereas the control signal s1 is supplied to the other one of the two input terminals of the OR circuit 22. Output from the OR circuit 22 is supplied to the switch M2 via the terminal for controlling conducting and blocking states of the switch M2. The control signal s1 is a signal for controlling the switch M2 to be in the conducting state or the blocking state.

This cusses the switch M2 to be conductive only in an operation mode in which the negative capacitance is used. The operation mode in which the negative capacitance is used is caused when the OR circuit 22 receives at least one of (i) the control signal s1 for controlling the switch M2 to be in the conducting state and (ii) the output, from the comparator 21, which is supplied in a case where it is determined that the data electric potential VData falls within the range in which the electric current not greater than the predetermined value is caused to pass through the data signal line Sj.

Accordingly, the switch M2 is caused to be in the blocking state when the data electric potential VData is greater than an electric potential (referred to as VData(n)) corresponding to a certain gray level, i.e., (i) when the constant current circuit 2*bj* causes an electric current greater than VData(n)/R to pass through the data signal line Sj so as to write the electric current to the pixel circuit Pixel or (ii) in a case of a mode in which the negative capacitance is not used.

In a case where (i) an electric current caused to pass through the data signal line Sj is large enough or (ii) a low-speed driving is carried out for example in a still image mode, delay in rise of a current waveform due to charging of parasitic capacitance may be ignorable even without the negative capacitance. In view of this, it is possible to reduce electric power consumption due to the use of the negative capacitance by, like the present embodiment, (a) causing the negative capacitance circuit 2*aj* to serve as the negative capacitance by causing the switch M2 to be in the conducting state only when the electric current caused to pass through the data signal line Sj is small or a high-speed scan is necessary and (b) causing the negative capacitance circuit 2*aj* not to serve as the negative capacitance by causing the switch M2 to be in the blocking state when the electric current caused to pass through the data signal line Sj is large or a sufficiently long data writing period is available. Note that, although the foregoing description is based on the assumption that the data signal for causing a certain current to pass through the data signal line Sj is a voltage, the data signal is not limited to this. Alternatively, it is possible to employ a configuration in which an electric current is used as it is as a signal source for the purpose of preventing variation due to resistance values. In such a case, the terminal of the switch M2 can be controlled by a comparator that senses a value of an electric current.

The foregoing descriptions discussed the embodiments.

Note that, although the foregoing embodiments described an organic EL display device which programs a data electric current, the embodiments are not limited to this. The embodiments can be applied to a display device or a drive circuit which uses a light emitting diode made from another material such as a semiconductor. This makes it possible to quickly program electric currents having uniform values in driving a light emitting element to be driven by an electric current.

Alternatively, the embodiments can be applied to a source driver which programs a voltage, such as for example a source driver of a liquid crystal display device. Although a program signal supplied to liquid crystal is a voltage, output impedance of a voltage source does not become zero. In order to reduce the output impedance, measures have been taken e.g., an aspect ratio of an output transistor is increased. However, this has led to an increase in area or power consumption. Correcting delay in a program time due to the limited output impedance by a negative capacitance circuit makes it possible to reduce the size of the output transistor. Further, the negative capacitance circuit 2*aj* is applicable to a passive matrix display device or a segment display device.

In recent years, not only a larger display device with higher definition, but also a display device achieving a high image quality by employing a double-speed driving or a quad-speed driving has been put into practice. In view of this, employing the present invention makes it possible to reduce a writing period, thereby making it possible to easily achieve a highly-functional display device.

In order to attain the above object, a display device in accordance with the present invention includes: a plurality of signal wires for supplying an image signal; a plurality of pixels in each of which an image is displayed in accordance with the image signal supplied from a corresponding one of the plurality of signal wires; at least one operational amplifier having (i) a non-inverting input terminal connected with a corresponding one of the plurality of signal wires, (ii) an inverting input terminal, and (iii) an output terminal; a first impedance element via which the non-inverting input terminal and the output terminal of said at least one operational amplifier are connected with each other; a second impedance element via which the inverting input terminal and the output terminal of said at least one operational amplifier are connected with each other; and a third impedance element via which the inverting input terminal of said at least one operational amplifier is connected with a reference voltage terminal, wherein, while (a) the corresponding one of the plurality of signal wires connected with the non-inverting input terminal and (b) pixels electrically connected with the corresponding one of the plurality of signal wires connected with the non-inverting input terminal are being supplied with the image signal, a value Zn of total impedance of the pixels electrically connected with the corresponding one of the plurality of signal wires connected with the non-inverting input terminal is represented by:

$$|Zn|<|Z1|\cdot|Z3$$

where Z1 is a value of impedance of the first impedance element, Z2 is a value of impedance of the second impedance element, and Z3 is a value impedance of the third impedance element.

According to the invention, it is possible to achieve negative capacitance with use of said at least one operational amplifier and first through third impedance elements.

The use of the negative capacitance allows for a quick response when parasitic capacitance is charged or discharged. This makes it possible to carry out, with a single circuit, both injecting and attracting of electric charge to/from the parasitic capacitance. As a result, a circuit to operate is reduced in size, thereby achieving a display device which consumes less electric power.

Further, a simple circuit configuration is achieved because no additional terminals are necessary for a panel. This is advantageous in terms of a reduction in a mounting area and a cost reduction.

As has been described, it is possible to achieve a display device capable of quick compensation of charging of parasitic capacitance with a simple configuration and low power consumption.

Further, the display device can be configured such that: the first impedance element and the second impedance element are of a same kind; and $|Z2|>|Z1|$.

According to the invention, it is possible to reduce a layout area of a negative capacitance circuit.

Alternatively, the display device can be configured such that: the second impedance element and the third impedance element are of a same kind; and $|Z2|>|Z3|$.

According to the invention, it is possible to reduce a layout area of a negative capacitance circuit.

In order to attain the above object, the display device in accordance with the present invention is configured such that: the first impedance element is a resistor element; the second impedance element is a resistor element; and the third impedance element is a capacitor element.

According to the invention, it is possible, with use of the resistor elements and the capacitor element, to easily achieve negative capacitance capable of stable operation.

In order to attain the above object, the display device in accordance with the present invention is configured such that: the first impedance element is a capacitor element; the second impedance element is a resistor element; and the third impedance element is a resistor element.

According to the invention, it is possible, with use of the resistor elements and the capacitor element, to easily achieve negative capacitance capable of stable operation.

Further, the capacitor element is provided instead of the resistor element on a feedback path of said at least one operational amplifier. Accordingly, even if trouble occurs in a differential amplifier of said at least one operational amplifier, it is possible to prevent output of said at least one operational amplifier from being supplied directly to a wire.

In order to attain the above object, the display device in accordance with the present invention is configured such that: the first impedance element is a capacitor element; the second impedance element is a capacitor element; and the third impedance element is a capacitor element.

According to the invention, it is possible, with use of the capacitor elements, to easily achieve negative capacitance capable of stable operation.

Further, the capacitor element is provided instead of the resistor element on a feedback path of said at least one operational amplifier. Accordingly, even if trouble occurs in a differential amplifier of said at least one operational amplifier, it is possible to prevent output of said at least one operational amplifier from being supplied directly to a wire.

Further, since the first through third impedance elements are not resistor elements but capacitor elements having element values more accurate than those of the resistor elements, it is possible to reduce variation in values of the negative capacitance.

In order to attain the above object, a display device in accordance with the present invention includes: a plurality of signal wires for supplying an image signal; a plurality of pixels in each of which an image is displayed in accordance with the image signal supplied from a corresponding one of the plurality of signal wires; at least one operational amplifier having (i) an inverting input terminal connected with a corresponding one of the plurality of signal wires, (ii) a non-inverting input terminal, and (iii) an output terminal; a first impedance element via which the inverting input terminal and the output terminal of said at least one operational amplifier are connected with each other; a second impedance element via which the non-inverting input terminal and the output terminal of said at least one operational amplifier are connected with each other; and a third impedance element via which the non-inverting input terminal of said at least one operational amplifier is connected with a reference voltage terminal, wherein, while (a) the corresponding one of the plurality of signal wires connected with the inverting input terminal and (b) pixels electrically connected with the corresponding one of the plurality of signal wires connected with the inverting input terminal are being supplied with the image signal, a value Zn of total impedance of the pixels electrically connected with the corresponding one of the plurality of signal wires connected with the inverting input terminal is represented by:

$$|Zn|>|Z1|\cdot|Z3|/|Z2|$$

where Z1 is a value of impedance of the first impedance element, Z2 is a value of impedance of the second impedance element, and Z3 is a value of impedance of the third impedance element.

According to the invention, it is possible to achieve negative capacitance with use of said at least one operational amplifier and first through third impedance elements. This makes it possible to quickly charge, with a simple circuit configuration, parasitic capacitance connected with a wire.

Further, the use of the negative capacitance allows for a quick response when parasitic capacitance is charged or discharged. This makes it possible to carry out, with a single circuit, both injecting and attracting of electric charge to/from the parasitic capacitance. As a result, a circuit to operate is reduced in size, thereby achieving a display device which consumes less electric power.

As described above, it is possible to achieve a display device capable of quick compensation of charging of parasitic capacitance with a simple configuration and low power consumption.

Further, the display device can be configured such that: the first impedance element and the second impedance element are of a same kind; and $|Z2|>|Z1|$.

According to the invention, it is possible to reduce a layout area of a negative capacitance circuit Alternatively, the display device can be configured such that: the second impedance element and the third impedance element are of a same kind; and $|Z2|>|Z3|$.

According to the invention, it is possible to reduce a layout area of a negative capacitance circuit.

In order to attain the above object, the display device in accordance with the present invention is configured such that:

the first impedance element is a resistor element; the second impedance element is a resistor element; and the third impedance element is a capacitor element.

According to the invention, it is possible, with use of the resistor elements and the capacitor element, to easily achieve negative capacitance capable of stable operation.

In order to attain the above object, the display device in accordance with the present invention is configured such that: the first impedance element is a capacitor element; the second impedance element is a resistor element; and the third impedance element is a resistor element.

According to the invention, it is possible, with use of the resistor elements and the capacitor element, to easily achieve negative capacitance capable of stable operation.

Further, the capacitor element is provided instead of the resistor element on a feedback path of said at least one operational amplifier. Accordingly, even if trouble occurs in a differential amplifier of said at least one operational amplifier, it is possible to prevent output of said at least one operational amplifier from being supplied directly to a wire.

In order to attain the above object, the display device in accordance with the present invention is configured such that: the first impedance element is a capacitor element; the second impedance element is a capacitor element; and the third impedance element is a capacitor element.

According to the invention, it is possible, with use of the capacitor elements, to easily achieve negative capacitance capable of stable operation.

Further, the capacitor element is provided instead of the resistor element on a feedback path of said at least one operational amplifier. Accordingly, even if trouble occurs in a differential amplifier of said at least one operational amplifier, it is possible to prevent output of said at least one operational amplifier from being supplied directly to a wire.

Further, since the first through third impedance elements are not resistor elements but capacitor elements having element values more accurate than those of the resistor elements, it is possible to reduce variation in values of the negative capacitance.

In order to attain the above object, a display device in accordance with the present invention further includes a constant current circuit for supplying a signal current to each of the plurality of signal wires.

According to the invention, it is possible to dramatically reduce delay in a data writing time, also in a display device which carries out an electric current programming that makes it possible to supply a drive current not affected by variation of drive transistors of pixels to a light emitting element. This makes it possible to achieve a large and high-definition display device.

In order to attain the above object, a display device in accordance with the present invention further includes: a second switch via which the non-inverting input terminal or the inverting input terminal of said at least one operational amplifier, which input terminal is to be connected with a corresponding one of the plurality of signal wires, is connected with the corresponding one of the plurality of signal wires, the second switch being conductive only when the second switch (i) receives, via its terminal for controlling conductive and blocking states of the second switch, an external control signal instructing the second switch to be conductive and/or (ii) receives, via the terminal, a data electric potential which causes an electric current not greater than a predetermined value to pass through the corresponding one of the plurality of signal wires.

According to the invention, the second switch is caused to be (i) in a conducting state so as to use the negative capacitance only when (a) the external control signal which instructs to use the negative capacitance and/or (b) an electric current caused to pass through a signal wire is small and (ii) in a blocking state so as not to use the negative capacitance when (c) the electric current caused to pass through the signal wire is so large that delay in rise of a current waveform due to the charging of the parasitic capacitance is ignorable or (d) a sufficiently long data writing period is available. This makes it possible to reduce power consumption due to the use of the negative capacitance.

In order to attain the above object, the display device in accordance with the present invention is an organic EL display device or an LED display device.

According to the invention, it possible to quickly program electric current having uniform values in driving a light emitting element to be driven by an electric current.

The present invention is not limited to the descriptions of the respective embodiments, but the embodiments may be combined or altered within the scope of the claims. An embodiment derived from a proper combination of technical means disclosed in different embodiments within the scope of the claims is encompassed in the technical scope of the invention.

INDUSTRIAL APPLICABILITY

The present invention is suitably applicable to various display devices such as an organic EL display device and an LED display device.

REFERENCE SIGNS LIST

2*bj* Constant current circuit
Sj Data signal line (Signal wire)
R1 Resistor (First impedance element, Resistor element)
R2 Resistor (Second impedance element, Resistor element)
Cn Capacitor (Third impedance element, Capacitor element)
Cn Capacitor (First impedance element, Capacitor element)
R2 Resistor (Second impedance element, Resistor element)
R1 Resistor (Third impedance element, Resistor element)
C1 Capacitor (First impedance element, Capacitor element)
C2 Capacitor (Second impedance element, Capacitor element)
Cn Capacitor (Third impedance element, Capacitor element)
OP1 Operational amplifier
OP2 Comparator
R Resistor (First resistor)
M1 Switching element (First switch)
M2 Switch (Second switch)
Z1, Z2, Z3 Values of impedance
Zn Value of impedance

The invention claimed is:

1. A display device, comprising:

a plurality of signal wires for supplying an image signal;

a plurality of pixels in each of which an image is displayed in accordance with the image signal supplied from a corresponding one of the plurality of signal wires;

at least one operational amplifier having (i) a non-inverting input terminal connected with a corresponding one of the plurality of signal wires, (ii) an inverting input terminal, and (iii) an output terminal;

a switch via which the non-inverting input terminal of said at least one operational amplifier is connected with the corresponding one of the plurality of signal wires, the switch having a control terminal for controlling conducting and blocking states of the switch;

a comparator configured to (i) compare a data electric potential with a reference potential that corresponds to a certain gray level and (ii) output a result of the comparison;

an OR circuit configured to receive an external control signal via one input terminal and receive the result of the comparison from the comparator via the other input terminal, output from the OR circuit being supplied to the control terminal of the switch;

a first impedance element via which the non-inverting input terminal and the output terminal of said at least one operational amplifier are connected with each other;

a second impedance element via which the inverting input terminal and the output terminal of said at least one operational amplifier are connected with each other; and a third impedance element via which the inverting input terminal of said at least one operational amplifier is connected with a reference voltage terminal, wherein, while (a) the corresponding one of the plurality of signal wires connected with the non-inverting input terminal and (b) pixels electrically connected with the corresponding one of the plurality of signal wires connected with the non-inverting input terminal are being supplied with the image signal, a value Zn of total impedance of the pixels electrically connected with the corresponding one of the plurality of signal wires connected with the non-inverting input terminal is represented by:

$$|Zn|>|Z1|\cdot|Z3|/|Z2|$$

where Z1 is a value of impedance of the first impedance element, Z2 is a value of impedance of the second impedance element, and Z3 is a value of impedance of the third impedance element, when the data electric potential is equal to or less than the reference potential, the switch is caused to be in the conductive state, and when the data electric potential is greater than the reference potential and the external control signal does not instruct the switch to be conductive, the switch is caused to be in the blocking state.

2. The display device according to claim 1, wherein:

the first impedance element and the second impedance element are of a same kind; and $$|Z2|>|Z1|.$$

3. The display device according to claim 1, wherein:

the second impedance element and the third impedance element are of a same kind; and $$|Z2|>|Z3|.$$

4. The display device according to claim 1, wherein:

the first impedance element is a resistor element;

the second impedance element is a resistor element; and the third impedance element is a capacitor element.

5. The display device according to claim 1, wherein:

the first impedance element is a capacitor element;

the second impedance element is a resistor element; and the third impedance element is a resistor element.

6. The display device according to claim 1, wherein:

the first impedance element is a capacitor element;

the second impedance element is a capacitor element; and the third impedance element is a capacitor element.

7. A display device, comprising:

a plurality of signal wires for supplying an image signal;

a plurality of pixels in each of which an image is displayed in accordance with the image signal supplied from a corresponding one of the plurality of signal wires;

at least one operational amplifier having (i) an inverting input terminal connected with a corresponding one of the plurality of signal wires, (ii) a non-inverting input terminal, and (iii) an output terminal;

a switch via which the inverting input terminal of said at least one operational amplifier is connected with the corresponding one of the plurality of signal wires, the switch having a control terminal for controlling conducting and blocking states of the switch;

a comparator configured to (i) compare a data electric potential with a reference potential that corresponds to a certain gray level and (ii) output a result of the comparison;

an OR circuit configured to receive an external control signal via one input terminal and receive the result of the comparison from the comparator via the other input terminal, output from the OR circuit being supplied to the control terminal of the switch;

a first impedance element via which the inverting input terminal and the output terminal of said at least one operational amplifier are connected with each other;

a second impedance element via which the non-inverting input terminal and the output terminal of said at least one operational amplifier are connected with each other; and a third impedance element via which the non-inverting input terminal of said at least one operational amplifier is connected with a reference voltage terminal, wherein, while (a) the corresponding one of the plurality of signal wires connected with the inverting input terminal and (b) pixels electrically connected with the corresponding one of the plurality of signal wires connected with the inverting input terminal are being supplied with the image signal, a value Zn of total impedance of the pixels electrically connected with the corresponding one of the plurality of signal wires connected with the inverting input terminal is represented by:

$$|Zn|>|Z1|\cdot|Z3|/|Z2|$$

where Z1 is a value of impedance of the first impedance element, Z2 is a value of impedance of the second impedance element, and Z3 is a value of impedance of the third impedance element, when the data electric potential is equal to or less than the reference potential, the switch is caused to be in the conductive state, and when the data electric potential is greater than the reference potential and the external control signal does not instruct the switch to be conductive, the switch is caused to be in the blocking state.

8. The display device according to claim 7, wherein:

the first impedance element and the second impedance element are of a same kind; and $$|Z2|>|Z1|.$$

9. The display device according to claim 7, wherein:

the second impedance element and the third impedance element are of a same kind; and $$|Z2|>|Z3|.$$

10. The display device according to claim 7, wherein:

the first impedance element is a resistor element;

the second impedance element is a resistor element; and the third impedance element is a capacitor element.

11. The display device according to claim 7, wherein:

the first impedance element is a capacitor element;

the second impedance element is a resistor element; and the third impedance element is a resistor element.

12. The display device according to claim 7, wherein:

the first impedance element is a capacitor element;

the second impedance element is a capacitor element; and the third impedance element is a capacitor element.

13. A display device according to claim 1, further comprising a constant current circuit for supplying a signal current to each of the plurality of signal wires.

14. The display device according to claim 1, wherein said display device is an organic EL display device or an LED display device.

* * * * *